United States Patent
Hong et al.

(10) Patent No.: US 10,074,776 B2
(45) Date of Patent: Sep. 11, 2018

(54) TRANSPARENT LIGHT EMITTING DIODE FILM

(71) Applicant: LG ELECTRONICS INC., Seoul (KR)

(72) Inventors: Daewoon Hong, Seoul (KR); Jeongsik Choi, Seoul (KR); Sangtae Park, Seoul (KR); Dongjin Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/379,328

(22) Filed: Dec. 14, 2016

(65) Prior Publication Data

US 2017/0358713 A1    Dec. 14, 2017

(30) Foreign Application Priority Data

Jun. 10, 2016 (KR) .................. 10-2016-0072539

(51) Int. Cl.
*H01L 33/56* (2010.01)
*H01L 33/58* (2010.01)
*B03B 9/04* (2006.01)
*H01L 33/42* (2010.01)
*H01L 23/00* (2006.01)
(Continued)

(52) U.S. Cl.
CPC ............. *H01L 33/42* (2013.01); *H01L 24/05* (2013.01); *H01L 25/0753* (2013.01); *H01L 33/486* (2013.01); *H01L 33/56* (2013.01); *H01L 33/62* (2013.01); *H01L 2224/05639* (2013.01)

(58) Field of Classification Search
CPC ......... H01L 33/42; H01L 33/56; H01L 33/62; H01L 33/486; H01L 24/05; H01L 25/0753

USPC ............. 257/70, 72, 79, 80, 82, 88, 90, 100, 257/E33.056, E33.059, E33.061, E33.067,
(Continued)

(56) References Cited

U.S. PATENT DOCUMENTS 9,748,450 B2 * 8/2017 Brandi .................. H01L 33/505
2007/0236628 A1 10/2007 Epstein
(Continued)

FOREIGN PATENT DOCUMENTS

JP    2006039122    2/2006
JP    2015076585    4/2015
(Continued)

OTHER PUBLICATIONS

Korean Intellectual Property Office Application No. 10-2016-0072539, Office Action dated Jun. 19, 2017, 7 pages.
(Continued)

*Primary Examiner* — Dao H Nguyen
(74) *Attorney, Agent, or Firm* — Lee, Hong, Degerman, Kang & Waimey PC

(57) ABSTRACT

A display device is provided. A transparent light emitting diode film includes: a base; an electrode layer located on the base and in which at least one pattern is formed; a pad formed in at least one portion on the electrode layer; a light emitting diode located on the pad; and an adhesive layer formed in at least another portion on the electrode layer, wherein in the adhesive layer, an opening portion is formed in a portion corresponding to the light emitting diode. Therefore, when forming the transparent light emitting diode film by including a material having strong heat resistance, a state change by a temperature may not occur.

21 Claims, 13 Drawing Sheets

(51) Int. Cl.
*H01L 25/075* (2006.01)
*H01L 33/48* (2010.01)
*H01L 33/62* (2010.01)

(58) Field of Classification Search
USPC ...... 257/E21.499; 362/231, 237; 438/22, 26, 438/27, 28, 29
See application file for complete search history.

(56) References Cited

U.S. PATENT DOCUMENTS

| | | | |
|---|---|---|---|
| 2008/0032142 A1* | 2/2008 | Tasumi | H01L 33/507 428/447 |
| 2008/0123355 A1 | 5/2008 | Wuu et al. | |
| 2010/0187546 A1* | 7/2010 | Fushimi | H01L 33/62 257/88 |
| 2012/0298310 A1* | 11/2012 | Iwase | B30B 5/02 156/580 |
| 2013/0043496 A1 | 2/2013 | Sabathil et al. | |
| 2013/0141667 A1 | 6/2013 | Son | |
| 2014/0203305 A1* | 7/2014 | Kawano | H01L 33/486 257/88 |
| 2014/0264398 A1* | 9/2014 | Ikeda | H01L 27/3204 257/88 |
| 2015/0171297 A1 | 6/2015 | Rhee et al. | |
| 2016/0218259 A1* | 7/2016 | Yamada | H01L 33/56 |

FOREIGN PATENT DOCUMENTS

| | | |
|---|---|---|
| KR | 1020040029381 | 4/2004 |
| KR | 1020100118457 | 11/2010 |
| KR | 1020110107933 | 10/2011 |
| KR | 2020150000138 | 1/2015 |

OTHER PUBLICATIONS

European Patent Office Application Serial No. 17175137.3, Search Report dated Aug. 25, 2017, 8 pages.

* cited by examiner ate a processor and a memory therein, may freely move, and may clearly repre-
TRANSPARENT LIGHT EMITTING DIODE FILM Pursuant to 35 U.S.C. § 119(a), this application claims the benefit of earlier filing date and right of priority to Korean Patent Application No. 10-2016-0072539 filed on Jun. 10, 2016, the entire contents of which are incorporated herein by reference for all purposes as if fully set forth herein.

BACKGROUND OF THE INVENTION

Field of the Invention

The present invention relates to a transparent light emitting diode film, and more particularly, to a transparent light emitting diode film whose state change by a temperature may not occur when forming the transparent light emitting diode film by including a material having strong heat resistance.

Discussion of the Related Art

Digital signage is a communication tool in which an advertiser may use for marketing, advertisement, and training and induce customer experience and is a digital image device that provides advertisement contents intended by the advertiser as well as common broadcasting contents at a public location such as an airport, a hotel, and a medical facility. Because digital signage houses a processor and a memory therein, may freely move, and may clearly represent various contents, at a department store, a subway, and a bus stop, the digital signage may be used for various uses such as promotion, a customer service, and a guide medium. Further, only advertisement contents are not provided but various contents having other objects other than advertisement may be provided through digital signage.

In digital signage, a plurality of light emitting diodes (LEDs) are generally used. Because the LED has a long life-span and high light emitting efficiency, the LED may replace a conventional fluorescent light and incandescent lamp. Further, because the LED is small, compared with a conventional light source, the LED has been spotlighted as a lighting device.

SUMMARY OF THE INVENTION

The present invention has been made to solve the foregoing problem and other problems. Another object is to provide a transparent light emitting diode film whose state change by a temperature may not occur when forming a transparent light emitting diode film.

An example embodiment of the present invention provides a transparent light emitting diode film including: a base; an electrode layer located on the base and in which at least one pattern is formed; a pad formed in at least one portion on the electrode layer; a light emitting diode located on the pad; and an adhesive layer formed in at least another portion on the electrode layer, wherein in the adhesive layer, an opening portion is formed in a portion corresponding to the light emitting diode.

A width of the light emitting diode may be smaller than that of the opening portion.

A height of the light emitting diode may be lower than that of the adhesive layer.

The base may include a Polyethylene Terephthalate (PET) film.

The electrode layer may include a silver nano wire.

The electrode layer may include: a common electrode connected to one end of the light emitting diode; and an individual electrode connected to the other end of the light emitting diode.

The common electrode may be a cathode, and the individual electrode may be an anode.

The common electrode and the individual electrode may be formed in a separated plurality of lines, and the line may include one common electrode and a plurality of individual electrodes.

The light emitting diode may exist in the plural, and the plurality of light emitting diodes may be separately located.

The pad may include silver (Ag).

The transparent light emitting diode film may further include a solder located at a portion corresponding to the light emitting diode on the pad.

The solder may include epoxy.

The solder may attach the pad and the light emitting diode using a low temperature Surface Mount Technology (SMT) process.

The transparent light emitting diode film may further include a Flexible Printed Circuit Board (FPCB) attached to one end of the electrode layer and that electrically connects the electrode layer to an external circuit.

The transparent light emitting diode film may further include at least one Printed Circuit Board (PCB) connected to the other end of the FPCB and that transfers an electric signal to the light emitting diode.

The adhesive layer may include an Optical Clear Adhesive (OCA).

The adhesive layer may include any one of silicon, acryl, and a combination thereof.

The transparent light emitting diode film may further include a protection layer located on the adhesive layer to protect the light emitting diode.

The adhesive layer may be in any one state of a first state in which one surface thereof is attached to an attached surface and a second state in which one surface thereof is separated from the attached surface, and the protection layer may be separated from the adhesive layer in the first state.

The adhesive layer may be in any one state of a first state in which one surface thereof is attached to an attached surface and a second state in which one surface thereof is separated from the attached surface, and the light emitting diode may be separated from the adhesive layer in the first state.

According to at least one of exemplary embodiments of the present invention, when forming a transparent light emitting diode film with a base including a material having strong heat resistance, a state change by a temperature may not occur.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
FIGS. 1, 2 and 3 are diagrams illustrating a process of forming a transparent light emitting diode film according to an exemplary embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to "or" being linked to" another component, this should be understood to mean that still another component (s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Figure 2:
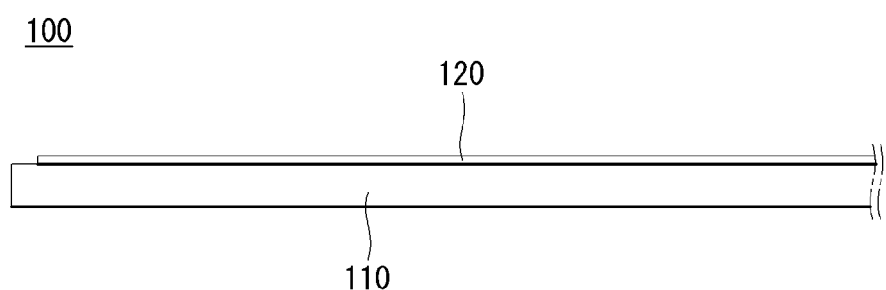
Figure 3:
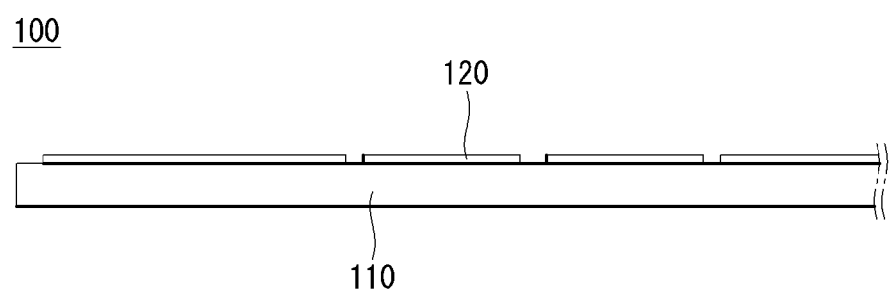

FIGS. 1 to 3 are diagrams illustrating a process of forming a transparent light emitting diode film according to an exemplary embodiment of the present invention.

As shown in FIG. 1, in a transparent light emitting diode film 100 according to an exemplary embodiment of the present invention, a base 110 may be first prepared. The base 110 may include a transparent material having a very thin thickness. For example, a thickness of the base 110 may be 250 μm.

The base 110 may include an insulating material. Accordingly, power used for driving a light emitting diode may not be leaked to the outside. For example, the base 110 may include a Polyethylene Terephthalate (PET) film. By adjusting a thickness of the base 110, heat resistance may be reinforced. A state of a PET film having the above-described thickness may not change at even a temperature of 200° C. or more. Accordingly, in a process of producing the transparent light emitting diode film 100, the base 110 may be stably maintained without a state change.

As shown in FIG. 2, an electrode layer 120 may be formed on the base 110. The electrode layer 120 may be a portion that drives a light emitting diode on the transparent light emitting diode film 100.

The electrode layer 120 may be coated on the base 110. The electrode layer 120 may include a metal nanowire. For example, the electrode layer 120 may include a silver (Ag) nano wire. The silver nano wire may have high conductivity and excellent transmittance.

As shown in FIG. 3, in the electrode layer 120, at least one pattern may be formed. For example, by radiating laser to the electrode layer 120, at least one pattern may be formed. However, the present invention is not limited thereto and the electrode layer 120 may be formed using mask and etching processes or other processes.

Because the electrode layer 120 has excellent transmittance, a portion having a pattern may not be easily viewed by an eye. Accordingly, a user may feel that an external appearance of the transparent light emitting diode film 100 is tidy.

Figure 4:
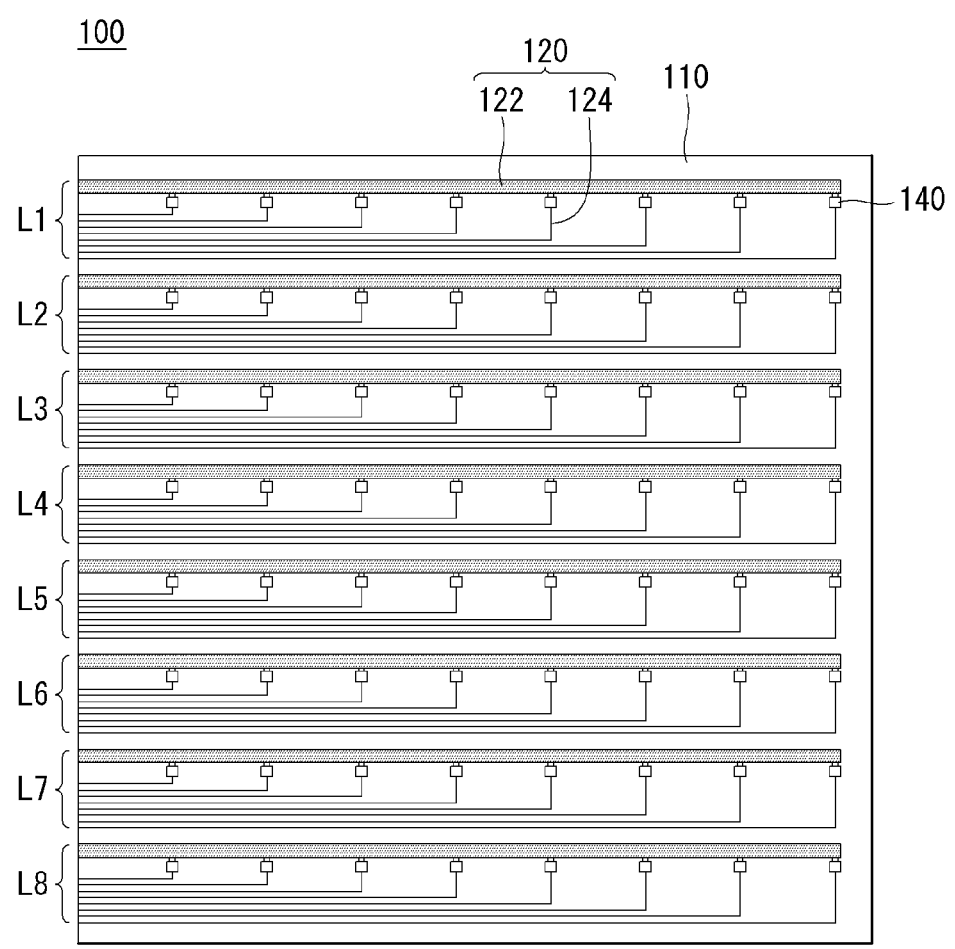
FIGS. 4 and 5 are diagrams illustrating a shape of an electrode layer according to an exemplary embodiment of the present invention.
Figure 5:
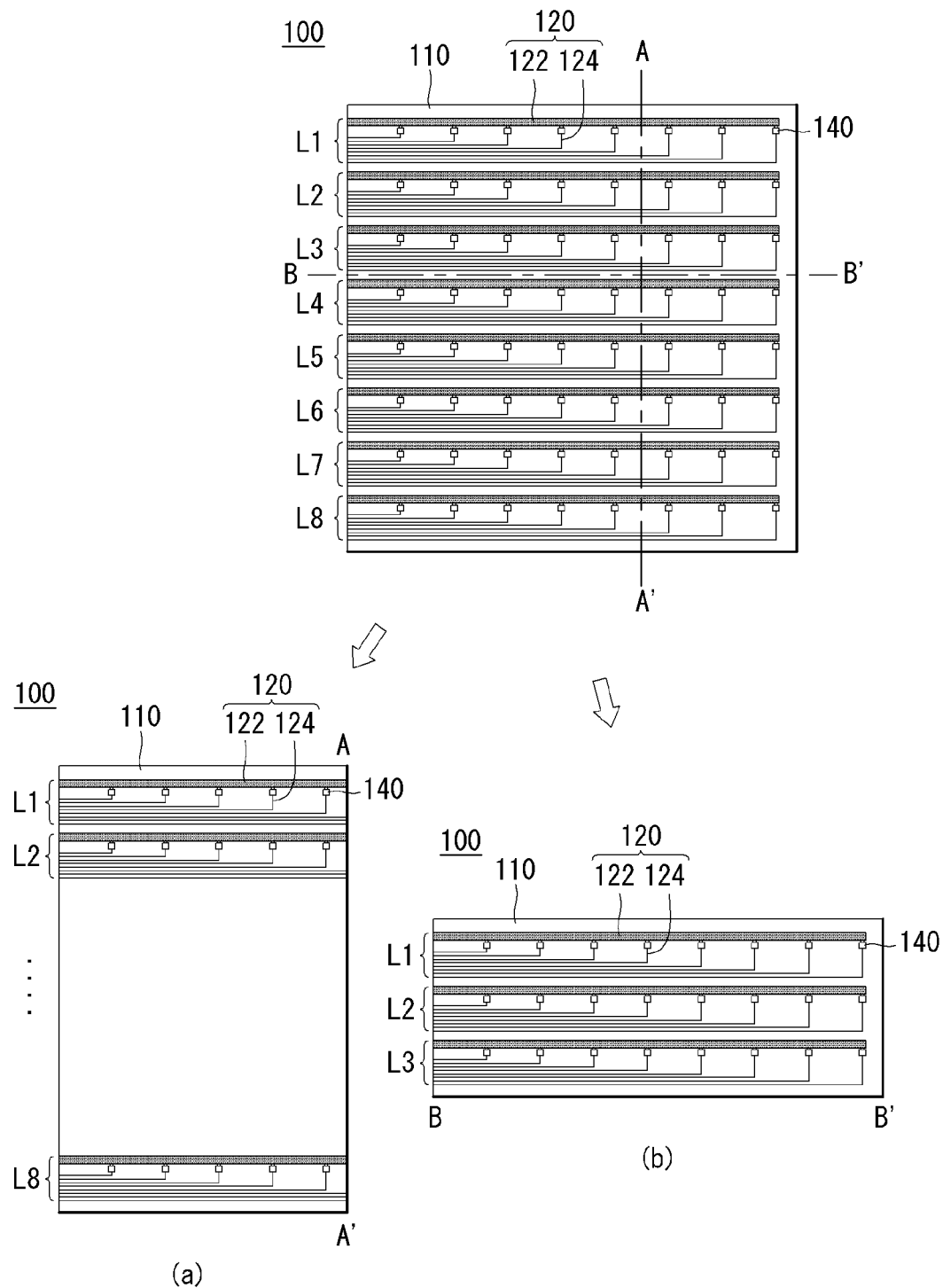

FIGS. 4 and 5 are diagrams illustrating a shape of an electrode layer according to an exemplary embodiment of the present invention.

As shown in FIG. 4, the electrode layer 120 may include a common electrode 122 and an individual electrode 124. The common electrode 122 may be extended in a first direction. The common electrode 122 may be connected to one side of a plurality of light emitting diodes 140. The plurality of light emitting diodes 140 may be are separated at a predetermined gap to be connected to the common electrode 122. The common electrode 122 may be an anode electrode.

The individual electrode 124 may be connected to the other side of the light emitting diode 140. Each light emitting diode 140 may be connected to another individual electrode 124. That is, each individual electrode 124 may be separated by a predetermined gap, as in the light emitting diode 140. The individual electrode 124 may be a cathode electrode.

Each individual electrode 124 may be driven and/or controlled through a constant current circuit. That is, each light emitting diode 140 may be separately driven and/or controlled.

The common electrode 122 and the individual electrode 124 may be formed in a plurality of lines L1-L8. Each line may be separately located. Each line may include one common electrode 122 and a plurality of individual electrodes 124. Each line may be individually driven. That is, the light emitting diodes 140 located at different lines may be different in the common electrode 122 as well as the connected individual electrode 124.

As shown in FIG. 5, a user may freely adjust a size of the transparent light emitting diode film 100. That is, as shown in FIG. 5, when space between lines adjacent to a line of at least one of the transparent light emitting diode film 100 is cut, operation and/or control of the common electrode 122 and the individual electrode 124 of the light emitting diode 140 may be maintained. That is, in a portion connected to the external circuit among cut portions of the transparent light emitting diode film 100, operation of the common electrode 122 and the individual electrode 124 may be still maintained.

For example, as shown in FIG. 5A, when the transparent light emitting diode film 100 is cut in a second direction, operation and/or control of the light emitting diodes 140 to the left of the cut connected to the external circuit may be maintained. Further, in the light emitting diodes 140 to the right of the cut, because the common electrode 122 and the individual electrode 124 are maintained, when the common electrode 122 and the individual electrode 124 are connected to the external circuit, operation and/or control of the light emitting diode 140 may be maintained.

In another example, as shown in FIG. 5B, when the transparent light emitting diode film 100 is cut in a first direction, operation and/or control of the entire of the upper light emitting diodes 140 and the lower light emitting diode 140 connected to the external circuit may be maintained.

FIGS. 6 to 9 are diagrams illustrating a process of forming a transparent light emitting diode film according to an exemplary embodiment of the present invention.

Figure 6:
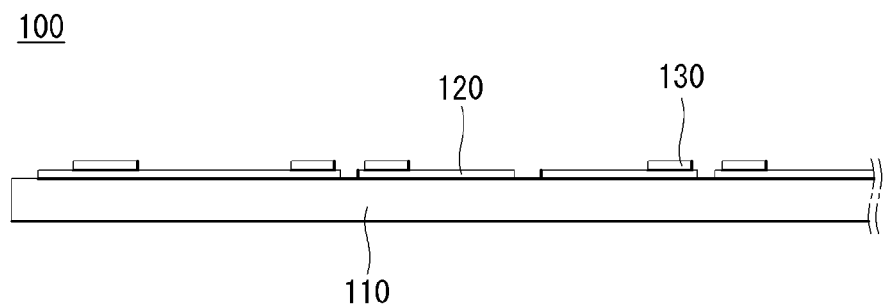
FIGS. 6, 7, 8 and 9 are diagrams illustrating a process of forming a transparent light emitting diode film according to an exemplary embodiment of the present invention.

As shown in FIG. 6, in at least one portion on the electrode layer 120, a pad 130 may be formed. The pad 130 may include a material having high conductivity. The pad 130 may be formed at a portion in which a light emitting diode on the electrode layer 120 is to be located. The pad 130 may be a portion to which a light emitting diode is attached. For example, the pad 130 may include silver (Ag).

Figure 7:
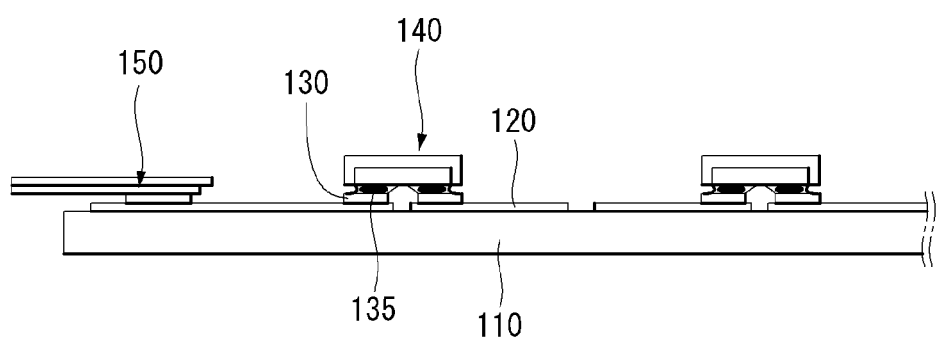

As shown in FIG. 7, the light emitting diode 140 may be fixed on the pad 130. The light emitting diode 140 may be fixed on the pad 130 using a low temperature Surface Mount Technology (SMT) process. A plurality of light emitting diodes 140 may be located. At least one of the light emitting diodes 140 may be separated from another light emitting diode 140.

A solder 135 may be printed on the pad 130. The solder 135 may assist the light emitting diode 140 to be attached to the pad 130. The solder 135 may include epoxy. Epoxy can improve strength of the solder 135.

When a heat is applied in a low temperature reflow process, the solder 135 may be hardly hardened to fix a component. The low temperature reflow process may be performed, for example in a condition of 300 seconds at 160° C. Because a melting point of the base 110, the electrode layer 120, and the pad 130 is high, in a low temperature reflow process, a state thereof may not be changed. Particularly, because a reflow process is performed at a low temperature, the reflow process may assist to change a state of the base 110.

An FPCB 150 may be attached on the pad 130 located at one end of the transparent light emitting diode film 100. The FPCB 150 may electrically connect the electrode layer 120 and the external circuit. Accordingly, the FPCB 150 may assist driving and/or control of the light emitting diode 140.

Figure 8:
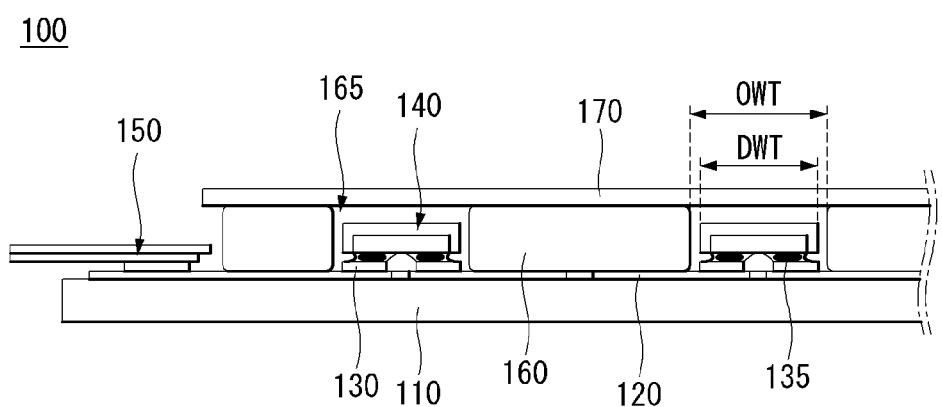

As shown in FIG. 8, in at least another portion on the electrode layer 120, an adhesive layer 160 is located, and a protection layer 170 may be covered on the adhesive layer 160. The adhesive layer 160 may include an Optical Clear Adhesive (OCA). For example, the adhesive layer 160 may include any one of silicon, acryl, and a combination thereof. In the adhesive layer 160, a bonding force of a vertical surface may be strong. A height of the adhesive layer 160 may be higher than that of the light emitting diode 140. Accordingly, the light emitting diode 140 may not contact the protection layer 160. A height of the adhesive layer 160 may be, for example from 500 μm to 800 μm.

The adhesive layer 160 may be located at a portion, except for the light emitting diode 140. That is, in the adhesive layer 160, in a portion corresponding to the light emitting diode 140, an opening portion 165 may be formed. A width OWT of the opening portion 165 may be larger than a width DWT of the light emitting diode 140. That is, the adhesive layer 160 may not contact the light emitting diode 140. Accordingly, even if the adhesive layer 160 is attached on the electrode layer 120, in operation of the light emitting diode 140, a problem may not occur.

The protection layer 170 may be located on the adhesive layer 160. The protection layer 170 is located on the adhesive layer 160 to enable the adhesive layer 160 not to be exposed to the outside. Accordingly, the protection layer 170 may conserve adhesive strength of the adhesive layer 160.

In order not to disturb operation and/or control of the light emitting diode 140, the protection layer 170 may be separated by a predetermined height from the light emitting diode 140. Accordingly, a thickness of the adhesive layer 160 may be larger than that of the light emitting diode 140.

The protection layer 170 may protect the transparent light emitting diode film 100 from an external impact. That is, even if an external force is applied, an impact may be less applied to the light emitting diode 140 by the protection layer 170.

Figure 9:
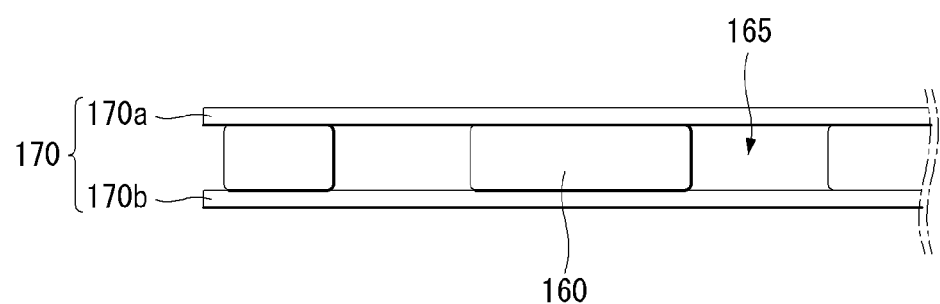

As shown in FIG. 9, the protection layer 170 may include first and second protection layers 170a and 170b. The first and second protection layers 170a and 170b may be attached to upper or lower surfaces of the adhesive layer 160. The first and second protection layers 170a and 170b may assist to maintain adhesive strength of the adhesive layer 160.

Before the adhesive layer 160 is coupled to a transparent light emitting diode film, the second protection layer 170b may be separated from the adhesive layer 160. Accordingly, the adhesive layer 160 of a state in which adhesive strength is maintained is attached to the transparent light emitting diode film 100 to protect a light emitting diode.

When attaching later a transparent light emitting diode film to another different location, the first protection layer 170a may be separated from the adhesive layer 160. Accordingly, the adhesive layer 160 may assist the transparent light emitting diode film to be attached to another portion.

In a transparent light emitting diode film according to an exemplary embodiment of the present invention, at both surfaces of the adhesive layer 160, the protection layer 170 may be located. Accordingly, the protection layer 170 protects the adhesive layer 160 to maintain adhesive strength of the adhesive layer 160.

Figure 10:
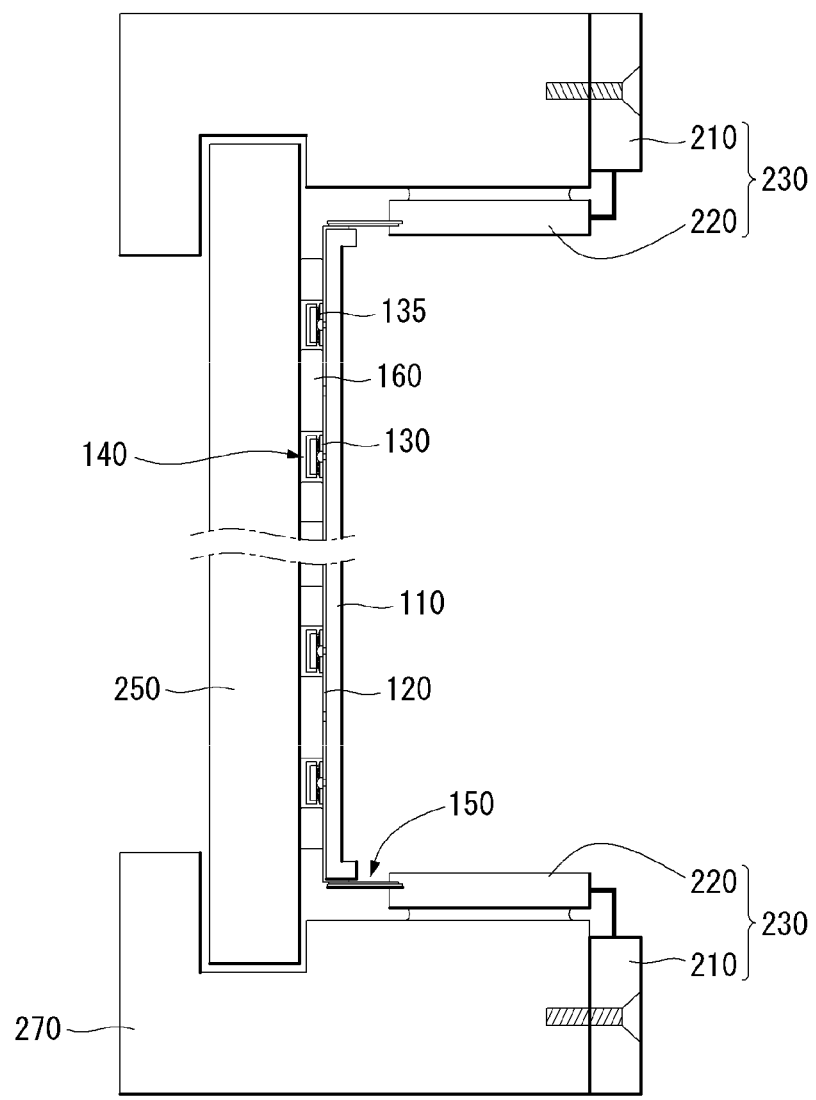
FIG. 10 is a diagram illustrating a transparent light emitting diode film according to an exemplary embodiment of the present invention.

FIG. 10 is a diagram illustrating a transparent light emitting diode film according to an exemplary embodiment of the present invention.

As shown in FIG. 10, the transparent light emitting diode film may be attached to an attached surface 250. When separating the first protection layer (170a FIG. 9) from the adhesive layer 160, the transparent light emitting diode film may be attached to the attached surface 250. The attached surface 250 may include a transparent material. The attached surface 250 may expose light discharged from the light emitting diode 140 to the outside. The attached surface 250 may be attached on the adhesive layer 160 of the transparent light emitting diode film. Because a thickness of the adhesive layer 160 is larger than that of the light emitting diode 140, the attached surface 250 may not contact the light emitting diode 140.

At an edge area of the attached surface 250, a sash 270 that fixes the attached surface 250 may be located. The sash 270 may have a shape that encloses an edge area of the attached surface 250. In order to fix the attached surface 250, the sash 270 may include a material having strong rigidity. For example, the sash 270 may include an aluminum, plastic, or metal material.

At least one PCB 230 for driving and/or controlling the light emitting diode 140 may be attached on the sash 270. The at least one PCB 230 may be attached to the rear side of the sash 270. One end of the at least one PCB 230 may be connected to the FPCB 150. Accordingly, the at least one PCB 230 may transfer an electric signal to the light emitting diode 140.

The at least one PCB 230 may include a power board 210 and a control board 220. The power board 210 may be fixed on the sash 270. One end of the power board 210 may be connected to the control board 220. The power board 210 may supply power to the transparent light emitting diode film. That is, the power board 210 may supply power to the light emitting diode 140. The power board 210 may change an AC frequency to a DC frequency. That is, the power board 210 changes a lower frequency to a high frequency, thereby enhancing electricity efficiency.

The control board 220 may be fixed on the sash 270. One end of the control board 220 may be connected to the power board 210 and the other end thereof may be connected to the FPCB 150. The control board 220 may transfer an input signal to the light emitting diode 140. That is, the control board 220 may transfer timing signals and a video signal to the light emitting diode 140.

In a transparent light emitting diode film according to an exemplary embodiment of the present invention, at least one PCB 230 may be located on the rear side of the sash 270. Accordingly, when the user views a screen of the transparent light emitting diode film at the front side, at least one PCB 230 may not be viewed.

Figure 11:
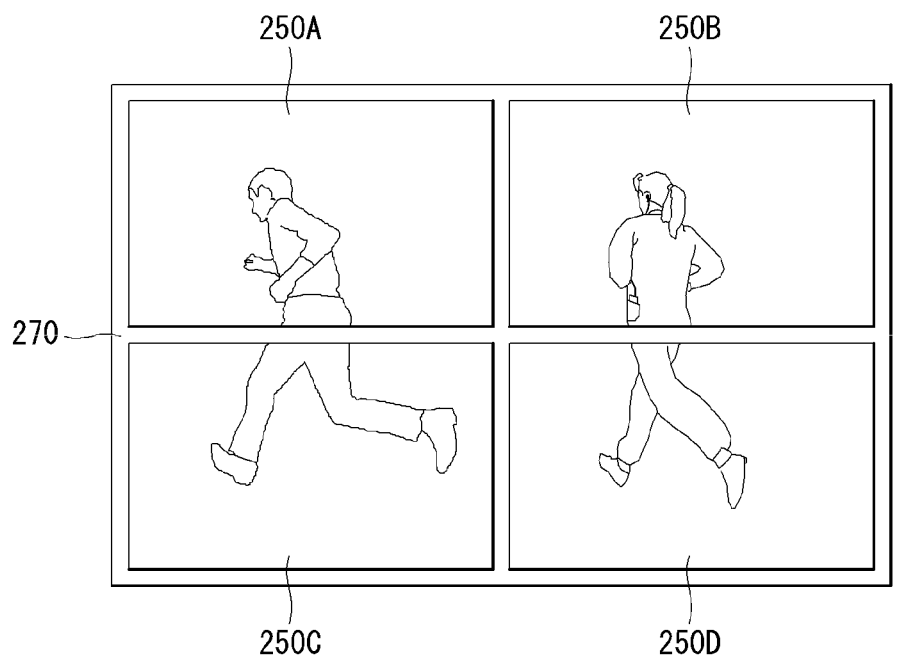
FIGS. 11, 12 and 13 are a diagram and perspective views illustrating a plurality of transparent light emitting diode films according to an exemplary embodiment of the present invention.
Figure 12:
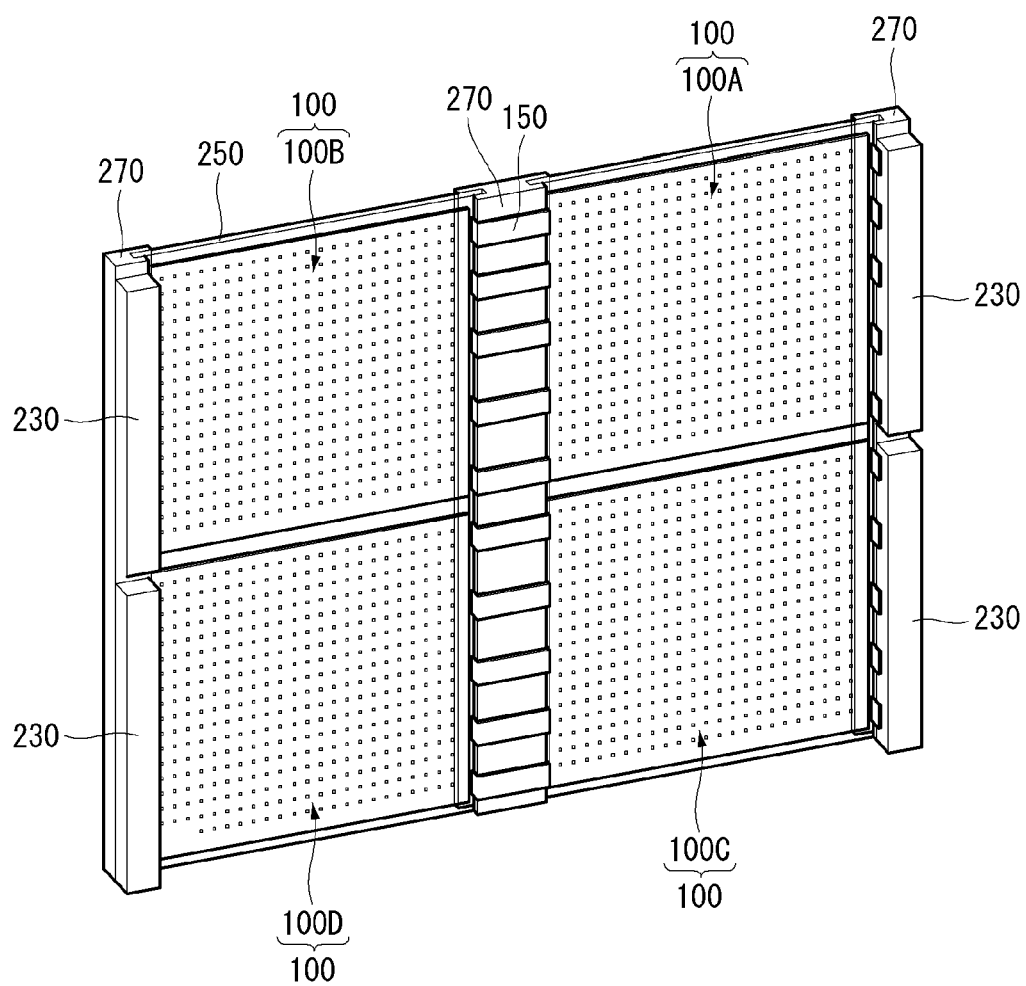
Figure 13:
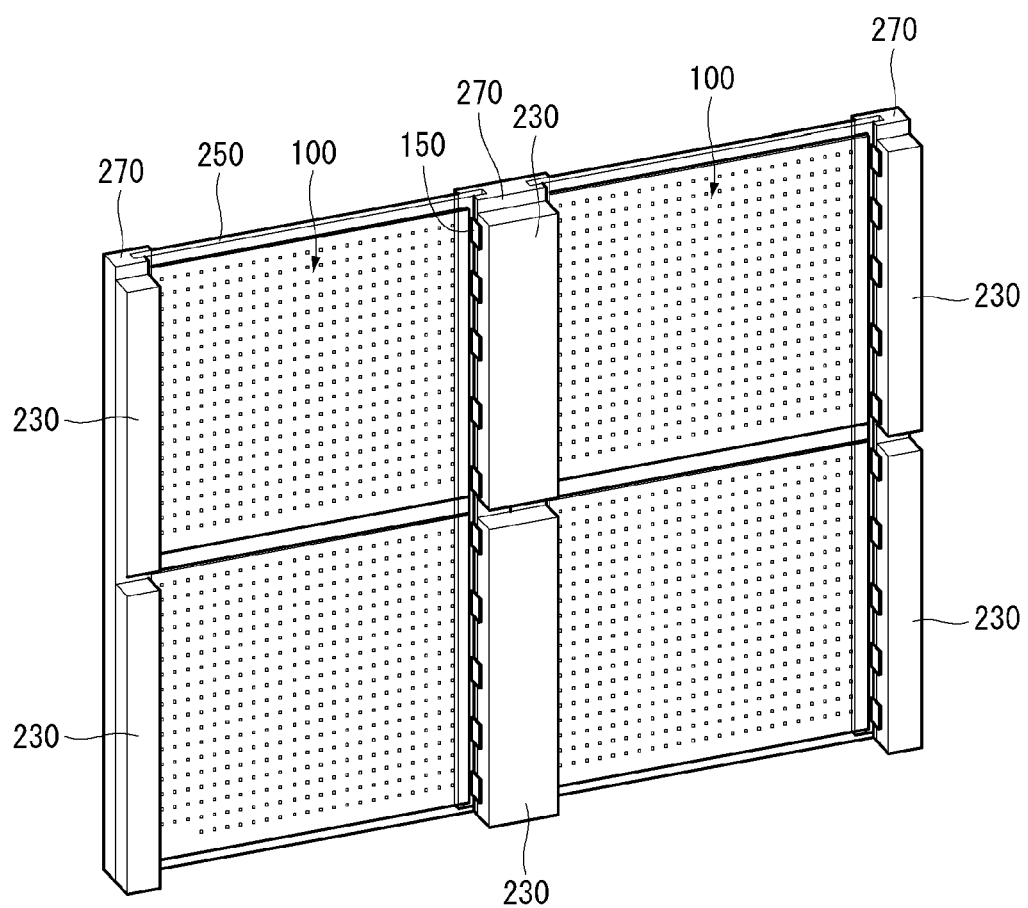

FIGS. 11 to 13 are a diagram and perspective views illustrating a plurality of transparent light emitting diode films according to an exemplary embodiment of the present invention.

As shown in FIG. 11, a transparent light emitting diode film according to an exemplary embodiment of the present invention may be attached to a plurality of attached surfaces 250A-250D to display one screen. That is, one image may be divided to be displayed on a plurality of attached surfaces 250A-250D.

By dividing an image signal according to a screen division method set in at least one PCB, a plurality of division images may be generated. Thereafter, each division image may be transmitted to each corresponding transparent light emitting diode film and may be output to a screen.

In a display device according to an exemplary embodiment of the present invention, because one screen is displayed on a plurality of transparent light emitting diode films, a very large image may be displayed on the screen.

As shown in FIG. 12, one end of at least one of a plurality of transparent light emitting diode films 100 may not be connected to the PCB 230. For example, one end of a first transparent light emitting diode film 100A may be connected to the other end of a second transparent light emitting diode film 100B through the FPCB 150. Further, one end of a third transparent light emitting diode film 100C may be connected to the other end of a fourth transparent light emitting diode film 100D through the FPCB 150. Accordingly, at least one PCB 230 is attached on the sash 270 located at both ends, but at the sash 270 located at a central portion, at least one PCB 230 may not be located. Accordingly, an electric signal for at least one transparent light emitting diode film 100A-100D may be received from at least another one transparent light emitting diode film 100A-100D as well as at least one PCB 230.

A portion of the transparent light emitting diode 100 according to an exemplary embodiment of the present invention may not be connected to at least one PCB 230. Accordingly, an installation cost of the transparent light emitting diode 100 can be reduced.

As shown in FIG. 13, the entire of both ends of a plurality of transparent light emitting diode films 100 may be connected to the PCB 230. That is, the PCB 230 may be located on a rear surface of the entire sash 270. In this case, even if an erroneous operation occurs at one PCB 230, the transparent light emitting diode film 100 that is not connected to a corresponding PCB 230 may normally operate. Accordingly, even if an erroneous operation occurs at one PCB 230, it may be quickly determined whether an erroneous operation has occurred at any portion.

Each exemplary embodiment and/or configuration of the present invention may be combined. For example, a configuration A described in a specific exemplary embodiment and/or drawing and a configuration B described in another exemplary embodiment and/or drawing may be combined. That is, even if a combination between configurations is not directly described, a combination is possible, except for a case of a description in which a combination is impossible. This will become apparent in consideration that the present invention relates to a display device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting diode film, comprising:
   a transparent base having a plate shape;
   a transparent adhesive layer formed on a front surface of the transparent base and comprising a hole;
   an electrode layer formed between the transparent base and the transparent adhesive layer;
   a light emitting diode positioned in the hole of the transparent adhesive layer; and
   a pad positioned in the hole of the transparent adhesive layer and configured to electrically connect the electrode layer and the light emitting diode; and
   a flexible printed circuit board (FPCB) connected to the front surface of the transparent base and electrically connected to the electrode layer.

2. The light emitting diode film of claim 1, wherein a width of the light emitting diode is smaller than a width of the hole of the transparent adhesive layer.

3. The light emitting diode film of claim 1, wherein a height of the light emitting diode located on the pad is lower than a height of the transparent adhesive layer.

4. The light emitting diode film of claim 1, wherein the transparent base comprises a Polyethylene Terephthalate (PET) film.

5. The light emitting diode film of claim 1, wherein the electrode layer comprises a silver nano wire.

6. The light emitting diode film of claim 1, wherein both a front surface and a rear surface of the transparent adhesive layer are adhesive.

7. The light emitting diode film of claim 1, wherein:
the electrode layer comprises a common electrode connected to one end of the light emitting diode and an individual electrode connected to another end of the light emitting diode;
the common electrode is a cathode, and
the individual electrode is an anode.

8. The light emitting diode film of claim 1, further comprising:
a plurality of light emitting diodes located on the film; and
the plurality of light emitting diodes respectively correspond to a plurality of lines wherein each line comprises the common electrode and an individual electrode of a plurality of individual electrodes.

9. The light emitting diode film of claim 1, further comprising a plurality of light emitting diodes located on the film, wherein the transparent adhesive layer is further shaped to define a plurality of holes each sized to accommodate a respective one of the plurality of light emitting diodes.

10. The light emitting diode film of claim 1, wherein the pad is composed of silver (Ag).

11. The light emitting diode film of claim 1, further comprising a solder between the light emitting diode and the pad.

12. The light emitting diode film of claim 11, wherein the solder is composed of epoxy.

13. The light emitting diode film of claim 11, wherein the solder is attached to the pad and the light emitting diode using a low temperature Surface Mount Technology (SMT) process.

14. The light emitting diode film of claim 1, wherein the FPCB is attached to one end of the electrode layer and electrically connecting the electrode layer to an external circuit.

15. The light emitting diode film of claim 14, further comprising at least one Printed Circuit Board (PCB) connected to one end of the FPCB and configured to permit communication of an electrical signal to the light emitting diode.

16. The light emitting diode film of claim 1, wherein the transparent adhesive layer comprises an Optical Clear Adhesive (OCA).

17. The light emitting diode film of claim 1, wherein the transparent adhesive layer comprises silicon or acryl.

18. The light emitting diode film of claim 1, further comprising a protection layer located on the transparent adhesive layer and covering the hole to protect the light emitting diode.

19. The light emitting diode film of claim 18, wherein the transparent adhesive layer is configured to be detachable from the protection layer and detachably attached to an attached surface.

20. The light emitting diode film of claim 1, wherein the transparent adhesive layer is configured to be detachably attached to an attached surface and the light emitting diode does not contact the attached surface when the transparent adhesive layer is attached to the attached surface.

21. The light emitting diode film of claim 1, wherein the light emitting diode film is transparent.

* * * * *